US010298290B1

(12) United States Patent
MacAnlis et al.

(10) Patent No.: US 10,298,290 B1
(45) Date of Patent: May 21, 2019

(54) RELIABLE, MAINTENANCE-FREE RADIO-FREQUENCY HARDWARE ARCHITECTURE

(71) Applicant: The Boeing Company, Chicago, IL (US)

(72) Inventors: Stephen A. MacAnlis, El Segundo, CA (US); Anthony C. Alongi, Redondo Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/877,322

(22) Filed: Jan. 22, 2018

(51) Int. Cl.
*H04B 1/04* (2006.01)
*H04B 1/74* (2006.01)
*H04B 7/185* (2006.01)
*H04B 7/08* (2006.01)
*H04B 7/06* (2006.01)

(52) U.S. Cl.
CPC ............. *H04B 1/74* (2013.01); *H04B 7/0615* (2013.01); *H04B 7/08* (2013.01); *H04B 7/18515* (2013.01)

(58) Field of Classification Search
CPC .......... H04B 1/74; H04B 7/0615; H04B 7/08; H04B 7/18515
USPC ....................................................... 455/103
See application file for complete search history.

(56) References Cited

U.S. PATENT DOCUMENTS 4,618,831 A * 10/1986 Egami ................... H01P 5/16
330/124 D
2010/0214017 A1 8/2010 Couchman et al.
2017/0149396 A1 5/2017 Clarke

OTHER PUBLICATIONS

Mallet et al., Multiport-Amplifier-Based Architecture Versus Classical Architecture for Space Telecommunication Payloads, IEEE Transactions on Microwave Theory and Techniques, Jan. 2007.

* cited by examiner

*Primary Examiner* — Sonny Trinh
(74) *Attorney, Agent, or Firm* — McDonnell Boehnen Hulbert & Berghoff LLP

(57) ABSTRACT

Redundancy architectures for communications systems are provided. An example redundancy architecture includes a plurality of active radio-frequency (RF) hardware units, one or more RF signal splitters configured to couple a plurality of RF input signals to the plurality of active RF hardware units, and one or more RF signal combiners configured to couple RF signals processed by the plurality of active RF hardware units to a plurality of RF output paths. The one or more RF signal splitters are configured to split each RF input signal of the plurality of RF input signals into multiple copies of the RF input signal, and to provide each copy of the multiple copies of the RF input signal to a different one of the plurality of active RF hardware units. The one or more RF signal combiners are configured to combine the multiple copies of the RF input signals into RF output signals.

18 Claims, 8 Drawing Sheets

RELIABLE, MAINTENANCE-FREE RADIO-FREQUENCY HARDWARE ARCHITECTURE

FIELD

The present disclosure relates generally to communication systems, and more particularly, to redundancy architectures for communications systems.

BACKGROUND

Many satellite communication systems are designed to operate for many years. In order to maintain reliability and prolong the working life of a satellite payload, the payload may be equipped with spare or redundant units that are designed to be switched into a signal path when an active unit fails. By way of example, a payload may include ten active low-noise amplifiers and two spare low-noise amplifiers. When one of the active low-noise amplifiers fails, one of the two spare low-noise amplifiers may be switched into a signal path of the failed low-noise amplifier.

Switching a spare unit into the signal path of a failed active unit may involve sending a radio-frequency (RF) command to an electromechanical switch. For instance, the electromechanical switch may have two positions: in a first position, the electromechanical switch may link an active unit to a signal path; and in a second position, the electromechanical switch may link a spare unit to the signal path. If the active unit fails, an RF command may be sent to the electromechanical switch, causing the switch to transition to the second position. Sending the RF command may involve operator intervention.

Moreover, when replacing a failed active hardware unit with a spare hardware unit, a disruption of service occurs. The length of the disruption of service spans between the time the failure of the active hardware unit occurs and the time it takes to switch in and activate the spare hardware unit, and re-initialize service. Improvements are therefore desired.

SUMMARY

In one example, a redundancy architecture for a communications system is described. The redundancy architecture includes a plurality of active radio-frequency (RF) hardware units arranged in parallel, one or more RF signal splitters configured to couple a plurality of RF input signals to the plurality of active RF hardware units, and one or more RF signal combiners configured to couple RF signals processed by the plurality of active RF hardware units to a plurality of RF output paths. The one or more RF signal splitters are configured to split each RF input signal of the plurality of RF input signals into multiple copies of the RF input signal, and to provide each copy of the multiple copies of the RF input signal to a different one of the plurality of active RF hardware units. For each of the plurality of RF input signals processed by the plurality of active RF hardware units, the one or more RF signal combiners are configured to combine the multiple copies of the RF input signal into an RF output signal, and to provide the RF output signal at an RF output path of the plurality of RF output paths corresponding to the RF input signal.

In another example, a redundancy architecture for a communications system is described. The redundancy architecture includes a series of input ports, a series of output ports, a plurality of active radio-frequency (RF) hardware units arranged in parallel, at least one RF signal splitter connecting the series of input ports to the plurality of active RF hardware units, and at least one RF signal combiner connecting the plurality of active RF hardware units to the series of output ports. The redundancy architecture is configured such that an RF input signal provided at any given input port of the series of input ports is split into multiple copies of the RF input signal that are then processed by respective active RF hardware units of the plurality of active RF hardware units and, after being processed, combined into an RF output signal at a given output port of the series of output ports.

In another example, a redundancy architecture for a communications system is described. The redundancy architecture includes m input ports, m output ports, n active radio-frequency (RF) hardware units arranged in parallel, an m×n input matrix connecting the m input ports to the n active RF hardware units, and an n×m output matrix connecting the n active hardware units to the m output ports. The redundancy architecture is configured such that an RF input signal provided at any given input port of the m input ports is split into n copies of the RF input signal that are then processed by respective active RF hardware units of the n active RF hardware units and, after being processed, combined into an RF output signal at a given output port of the m output ports.

The features, functions, and advantages that have been discussed can be achieved independently in various examples or may be combined in yet other examples further details of which can be seen with reference to the following description and figures.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying figures, wherein:

DETAILED DESCRIPTION

Disclosed examples will now be described more fully hereinafter with reference to the accompanying figures, in which some, but not all of the disclosed examples are shown. Indeed, several different examples may be provided and should not be construed as limited to the examples set forth herein. Rather, these examples are provided so that this disclosure will be thorough and complete and will fully convey the scope of the disclosure to those skilled in the art.

Figure 1:
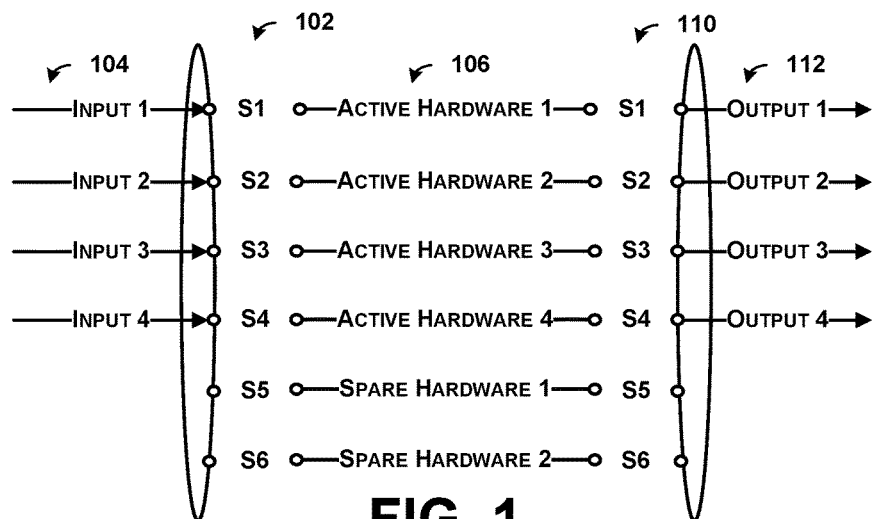
FIGS. 1 and 2 illustrate part of a conventional communications satellite payload.

FIG. 1 conceptually illustrates an example configuration of part of a conventional communications satellite payload. As shown in FIG. 1, the communications satellite payload may include an input redundancy ring switch 102 that connects a plurality of input paths 104 to a plurality of active hardware units 106. The input redundancy ring switch 102 may include six switches, each of which can be positioned in a nominal position, an up position, or a down position. Initially, the six switches of the input redundancy ring switch 102 may each be positioned in the nominal position, such that a first switch S1 links "input 1" to "active hardware 1", a second switch S2 links "input path 2" to "active hardware 2", and so forth. As further shown in FIG. 1, the communications satellite payload may also include an output redundancy ring switch 110 that connects the plurality of active hardware units 106 to a plurality of output paths 112.

Figure 2:
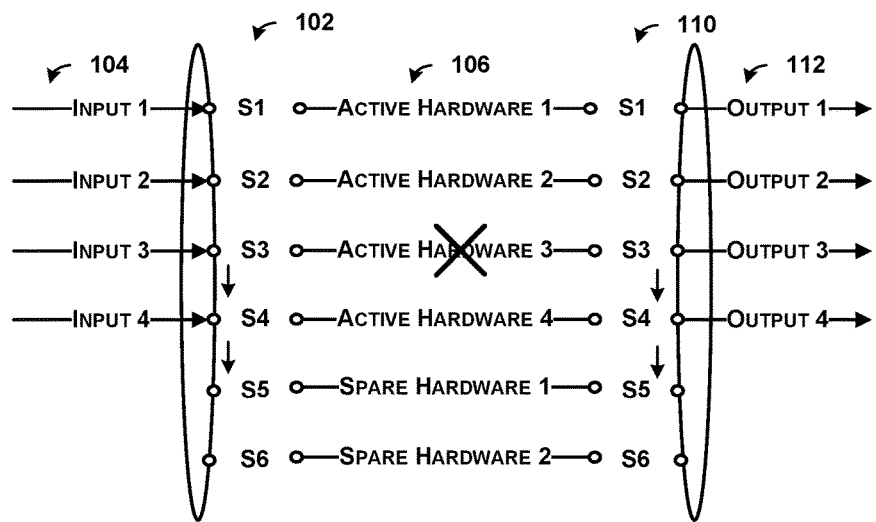

In operation, when one of the active hardware units fail, individual switches of the input redundancy ring switch 102 and the output redundancy ring switch 110 are shuffled up or down to replace the failed active hardware unit with a spare hardware unit. For example, as shown in FIG. 2, a third switch S3 and a fourth switch S4 of the input redundancy ring switch 102 are switched to the down position, such that the third switch S3 links "input 1" to "active hardware 4" and the fourth switch S4 links "input 4" to "spare hardware 1". In addition, a third switch S3 and a fourth switch S4 of the output redundancy ring switch 110 are switched to the down position, such that the third switch S3 links "active hardware 4" to "output 3" and the fourth switch S4 links "spare hardware 1" to "output path 4".

When using a redundancy ring switch, such as the input redundancy ring switch 102 or output redundancy ring switch 110 of FIGS. 1 and 2, individual switches of the redundancy ring switch are controlled using special commands. In particular, the individual switches are controlled individually by sending high voltage pulses to the switches, with the pulse causing the switch to transition to a different position. Thus, operator intervention may be required to when an active hardware unit fails.

Moreover, when shuffling the switches of a redundancy ring switch to replace a failed active hardware unit with a spare hardware unit, a disruption of service occurs. For instance, when replacing "active hardware 3" with "spare hardware 1", a disruption of service occurs between "input 3" and "output 3" as well as between "input 4" and "output 4". The length of the disruption of service spans between the time the failure of the active hardware unit occurs and the time it takes to switch in and activate the spare hardware unit, and re-initialize service.

Described herein are systems for providing redundancy that address the above-mentioned issues. As described herein, the systems allow for one set of hardware units to be shared among one or many RF paths without the use of redundancy switches and the associated operator intervention for commanding switches. As such, the systems can provide redundancy in the event of a failure without any disruption of service.

By way of example, a redundancy architecture for a communications system is provided. The redundancy architecture includes a plurality of active RF hardware units arranged in parallel, one or more RF signal splitters configured to couple a plurality of input signals to the plurality of active hardware units, and one or more RF signal combiners.

The one or more RF signal splitters are configured to split each RF input signal of the plurality of RF input signals into multiple copies of the RF input signal, and to provide each copy of the multiple copies of the RF input signal to a different one of the plurality of active RF hardware units. Further, the one or more RF signal combiners are configured to couple RF signals processed by the plurality of active RF hardware units to a plurality of RF output paths. For each of the plurality of RF input signals processed by the plurality of active RF hardware units, the one or more RF signal combiners are configured to combine the multiple copies of the RF input signal into an RF output signal, and to provide the RF output signal at an RF output path of the plurality of RF output paths corresponding to the RF input signal.

In some embodiments, the communications system for which the redundancy architecture provides redundancy may be a communications system of a spacecraft, such as a satellite. In other embodiments, the communications system may be a communications system of an aircraft. The redundancy architectures described herein can also be used in order to provide redundancy for any type of RF hardware where high reliability and/or disruption of service is a concern, such as a communication gateway or hub.

Advantageously, the redundancy architectures disclosed herein may require less hardware and be less complicated than conventional communications systems, such as the communications satellite payload shown in FIGS. 1 and 2. For instance, the redundancy architectures may reduce or eliminate the use of switches for switching in spare hardware units and the associated amount of commanding hardware and software for controlling those switches. In addition, the redundancy architectures can remove the need for any redundancy hardware, such as spare hardware units. As an example, a redundancy architecture can have four active hardware units and no spare hardware units. Whereas, a conventional communications system providing the same level of redundancy may have four active hardware units and two spare hardware units. Hence, the redundancy architecture reduces the total number of hardware units from six to four.

Further, the design of the redundancy architectures disclosed herein allow for graceful degradation during a failure. In a communications system having a redundancy architecture configured in the manner disclosed herein, once an active hardware unit fails, the communications system can continue to operate at a gracefully degraded state. As described more fully below, the failure of the active hardware unit causes distributed signal degradation, rather than causing a signal interruption.

Various other features of the systems and methods are also described hereinafter with reference to the accompanying figures.

Figure 3:
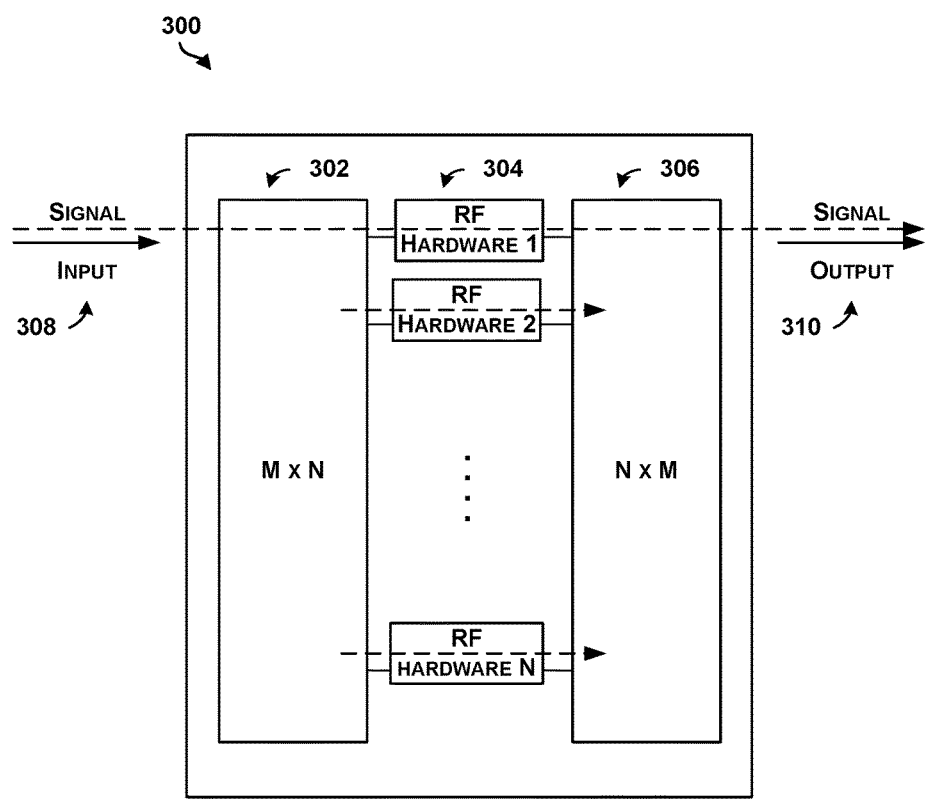
FIGS. 3 and 4 illustrate an example redundancy architecture for a communications system, according to an example embodiment.

Referring now to FIG. 3, an example redundancy architecture 300 for a communications system is illustrated. As shown in FIG. 3, the redundancy architecture 300 includes an m×n input network 302, n active RF hardware units 304, and an n×m output network 306.

The m×n input network 302 is an input network that includes m inputs and n outputs, where m is an integer, n is integer, and m is greater than or equal to n. For instance, n may be two and n may be two or an integer that is greater than two. Alternatively, n may be four, eight, or sixteen. Other examples are also possible. Each of the m inputs can be coupled to an RF input signal by way of a respective RF input path 308. In one example, there may be m RF input signals, and each of the RF input signals can pass through the m×n input network 302 orthogonal to one another. Further, the RF input signals can operate over the same frequency band. For ease of explanation, only one RF input signal and one RF input path are illustrated in FIG. 3.

Further, each of the n outputs can be coupled to a different one of the n active RF hardware units 304. For instance, a first output can be coupled to a first active RF hardware unit, a second output can be coupled to a second active RF hardware unit, and so forth.

In one example, the m×n input network 302 can be configured to split each of the RF input signals into multiple copies of the RF input signal and to provide each copy of the multiple copies of the RF input signal to a different one of the n active RF hardware units. The m×n input network 302 can be implemented using at least one RF splitter (not shown). For instance, there may be two RF input signals and two active RF hardware units in a communications system, and the m×n input network 302 may be a 2×2 input network. The 2×2 input network can split a first RF input signal into a first power-reduced RF signal having a same phase as the first RF input signal and a second power-reduced RF signal having a different phase than the phase of the first RF input signal. Additionally, the 2×2 input network can split a second RF input signal into a third power-reduced RF signal having a same phase as the second RF input signal and a fourth power-reduced RF signal having a different phase than the phase of the second RF input signal. The 2×2 input network can then provide the first and third power-reduced RF signals to a first active RF hardware unit and provide the second and fourth power-reduced RF signals to a second active RF hardware unit.

In one example, the n active RF hardware units 304 can be n low-noise amplifiers. More generally, the n active RF hardware units 304 can be any type of active hardware unit provided on a communications system.

The n×m output network 306 is an output network that includes n inputs and m outputs. Each of the n inputs can be coupled to a different one of the n active RF hardware units. For instance, a first input can be coupled to the first active RF hardware unit, a second input can be coupled to the second active RF hardware unit, and so forth. Further, each of the m outputs can be coupled to a different RF output path. For ease of explanation, only one RF output path is illustrated in FIG. 3.

In one example, the n×m output network 306 can be configured to combine multiple copies of an RF input signal into an RF output signal, and to provide the RF output signal at an RF output path corresponding to the RF input signal. For instance, in a communications system having two RF input signals, the n×m output network 306 can be configured to combine multiple copies of a first RF input signal into a first RF output signal, and to provide the first RF output signal to a first RF output path. Further, the n×m output network 306 can be configured to combine multiple copies of a second RF input signal into a second RF output signal, and to provide the second RF output signal to a second RF output path. The RF output signals provided by the n×m output network 306 can be orthogonal to one another.

Figure 4:
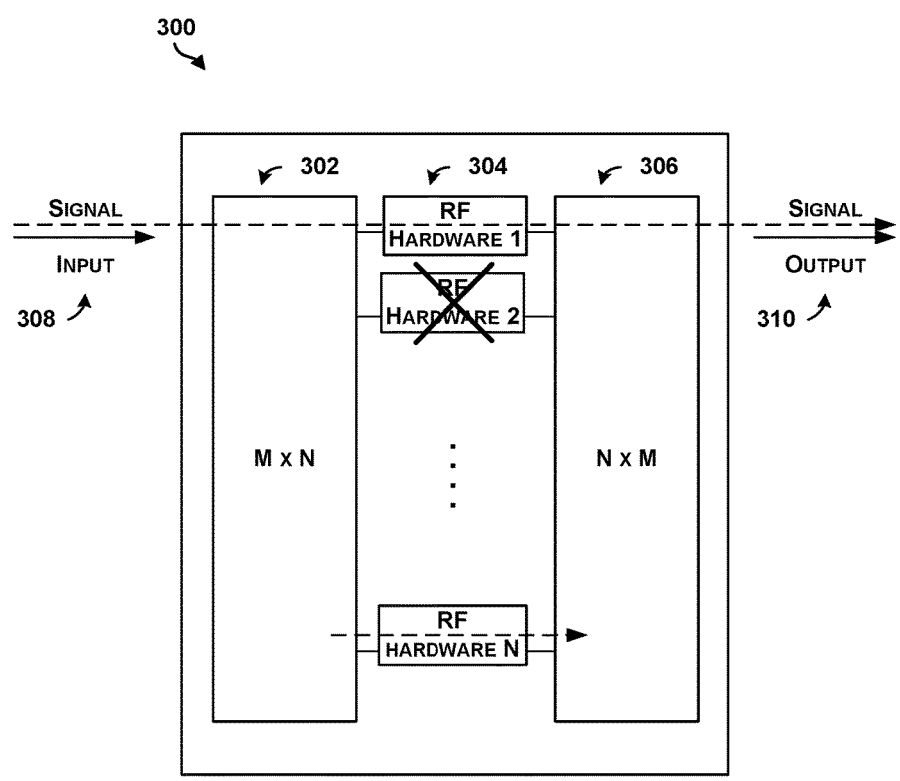

As discussed above, the redundancy architecture 300 can be configured such that a failure of any given one of the n active RF hardware units causes distributed signal degradation rather than causing a signal interruption. By way of example, as shown in FIG. 4, when a second active RF hardware unit of the n active RF hardware units 304 fails, RF signals processed by the second active RF hardware unit may be corrupted or the second active RF hardware unit might not output any signals. However, since the RF input signal input at the RF input path 308 is split into multiple copies of the RF input signal, only the copy of the RF input signal that is provided to the second active RF hardware unit is adversely affected by the failure; the other copies of the RF input signal can still be processed by the other active RF hardware units, respectively. As a result, the RF output signal provided at the RF output path 310 is still present, albeit in a degraded state. Similarly, RF output signals corresponding to each of the other RF input signals are also still present at corresponding RF output paths, albeit in degraded states. In other words, the redundancy architecture 300 can still provide all of the RF output signals at the RF output paths, and can do so without having to switch in any spare hardware, such as a spare RF hardware unit. In some instances, multiple failures could be tolerated. For instance, the redundancy architecture 300 can be configured such that upon a failure of any give one or more of the n active RF hardware units, the redundancy architecture 300 still provides all of the RF output signals at the RF output paths without having to switch in a spare RF hardware unit.

In practice, the impact of the loss of one of the active RF hardware units decreases as n increases. In a communication system where n equals two, a failed active RF hardware unit would adversely impact the quality of signals provided at the RF output paths more than the amount by which a failed active RF hardware unit would impact the quality of signals provided at the RF output paths where n equals eight. This is because, when n equals two, each RF input signal is split into two copies of the RF input signals, and a loss of one of the active RF hardware units affects half of the copies of each RF input signal. Whereas, when n equals eight, each RF input signal is split into eight copies, and a loss of one of the active RF hardware units affects one-eighth of the copies of each RF input signal.

Figure 5:
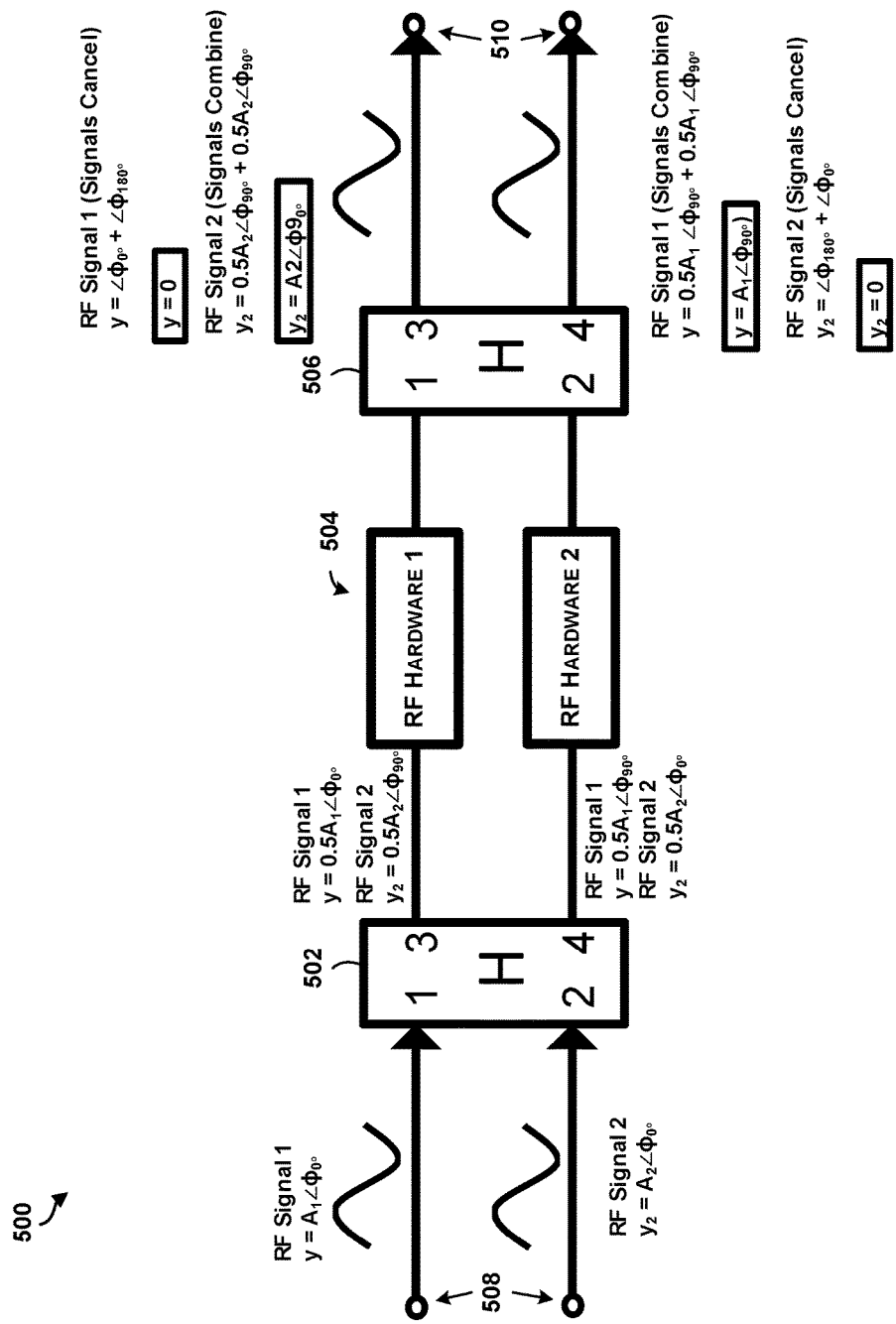
FIG. 5 illustrates another example redundancy architecture for a communications system, according to an example embodiment.

As noted above, in some examples, the m×n input network 302 can be implemented using at least one RF splitter and/or the m×n output matrix can be implemented using an least one RF combiner. FIG. 5 illustrates another example redundancy architecture 500 for a communications system. In particular, FIG. 5 illustrates an example redundancy architecture 500 having an RF signal splitter 502, two active RF hardware units 504, and an RF signal combiner 506.

The RF signal splitter 502 couples two RF input signals provided at two input ports 508, respectively, to the two active RF hardware units 504. Specifically, the RF signal splitter 502 splits a first RF input signal designated as "RF Signal 1" in FIG. 5 into a first power-reduced RF signal and a second power-reduced RF signal, with the second power-reduced RF signal being phase-shifted 90 degrees with respect to the first power-reduced RF signal. The first power-reduced RF signal is then provided to a first active RF hardware unit that is labeled as "RF Hardware 1" in FIG. 5, and the second power-reduced RF signal is then provided to a second active RF hardware unit that is labeled as "RF Hardware 2" in FIG. 5. Similarly, the RF signal splitter 502 splits a second RF input signal designated as "RF Signal 2" in FIG. 5 into a third power-reduced RF signal and a fourth power-reduced RF signal, with the fourth power-reduced RF signal being phase-shifted 90 degrees with respect to the third power-reduced RF signal. The third power-reduced RF signal is then provided to the second active RF hardware unit, and the fourth power-reduced RF signal is then provided to the second active RF hardware unit.

The RF signal combiner 506 then couples signals processed by the two active RF hardware units 504 to two output ports 510. Specifically, after the first active RF hardware unit processes the first power-reduced RF signal and third power-reduced RF signal, the RF signal combiner 506 splits the first power-reduced RF signal into a first copy and a second copy, with the second copy being phase-shifted 90 degrees with respect to the first copy. Similarly, the RF signal combiner 506 splits the third power-reduced RF signal into a first copy and a second copy, with the second copy being phase-shifted 90 degrees with respect to the first copy. Further, after the second active RF hardware unit processes the second power-reduced RF signal and the fourth power-reduced RF signal, the RF signal combiner 506 splits the second power-reduced RF signal into two copies and splits the fourth power-reduced RF signal into two copies.

Due to the phase shifts implemented by the RF signal splitter 502 and the RF signal combiner 506, copies of "RF Signal 1" provided at a first output port of the two output ports 510 are 180 degrees out of phase with respect to each other and, therefore, effectively cancel each other out. On the other hand, copies of "RF Signal 1" provided at a second output port of the two output ports 510 have the same phase and are constructively combined together. Further, copies of "RF Signal 2" provided at the first output port have the same phase and are constructively combined together, while copies of "RF Signal 2" provided at the second output port are 180 degrees out of phase with respect to each other and, therefore, effectively cancel each other out.

The amplitudes of the signals shown at the output ports 510 in FIG. 5 may differ, depending on the type of processing carried out by the two active RF hardware units 504. For instance, the active RF hardware units 504 may include amplifiers that amplify the RF signals output by the RF signal splitter 502, thereby amplifying the amplitude of the signals provided at the output ports 510.

Figure 6A:
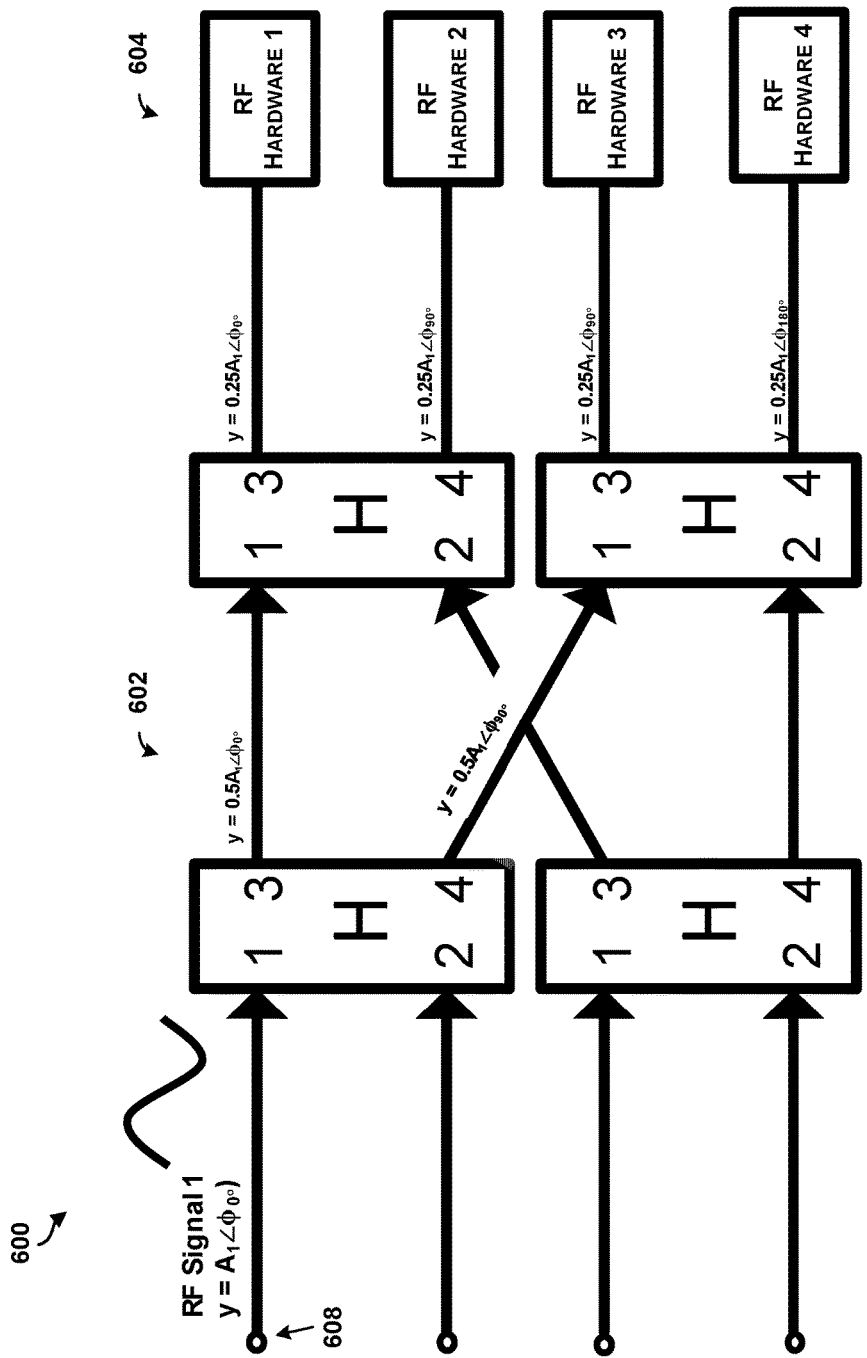
FIGS. 6A and 6B illustrate another example redundancy architecture for a communications system, according to an example embodiment.
Figure 6B:
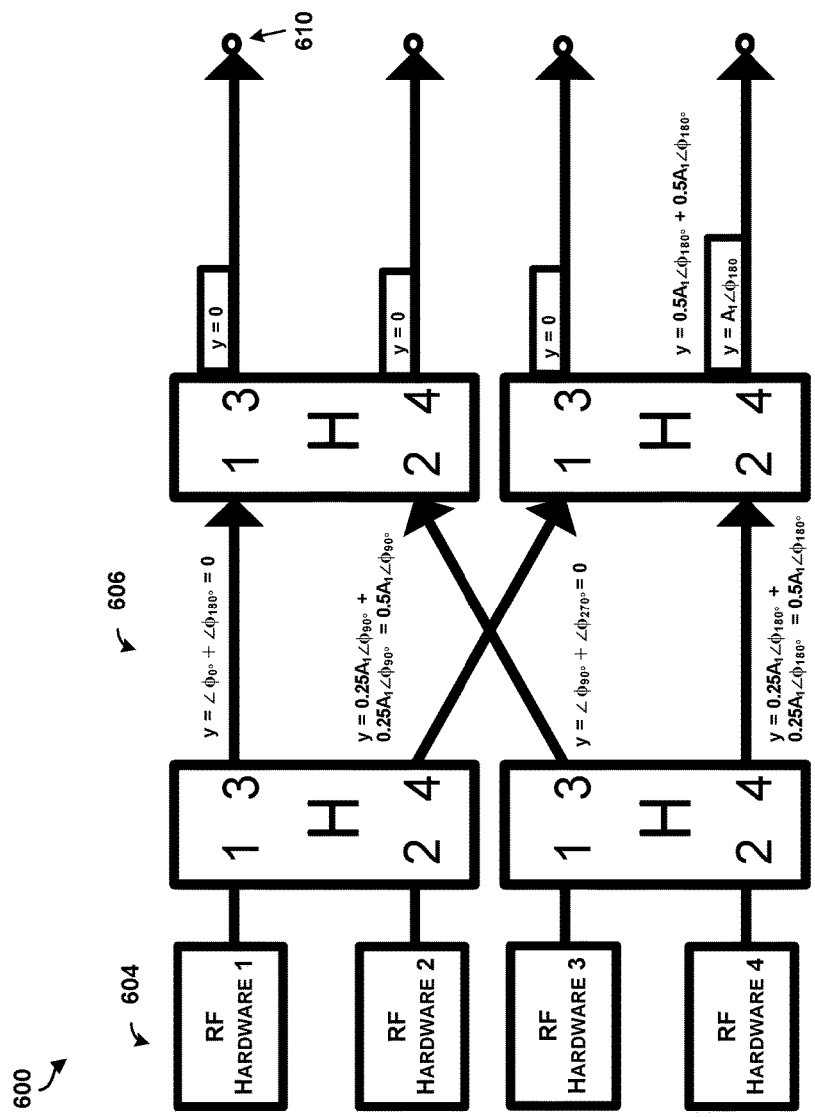

In some examples, the m×n input network 302 of FIGS. 3 and 4 can be implemented using an input matrix and/or the n×m output network 306 of FIGS. 3 and 4 can be implemented using an output matrix. FIGS. 6A and 6B illustrate another example redundancy architecture 600 for a communications system. In particular, FIGS. 6A and 6B illustrate an example redundancy architecture 600 having an input matrix 602, four active RF hardware units 604, and an output matrix 606.

The input matrix 602 is a 4×4 Butler matrix that couples four RF input signals provided at four input ports 608, respectively, to the four active RF hardware units. For ease of explanation, only a signal RF input signal designated as "RF Signal 1" is shown in FIGS. 6A and 6B. As shown in FIG. 6A, the input matrix 602 includes four RF signal splitters arranged such that the input matrix 602 splits "RF Signal 1" into four power-reduced RF signals that are provided at the four active RF hardware units, respectively.

The output matrix 606 is a 4×4 Butler matrix that is the inverse of the input matrix 602. The output matrix 606 couples RF signals processed by the four active RF hardware units 604 to four output ports 610. As shown in FIG. 6B, the output matrix 606 includes four RF signal combiners arranged such that the output matrix 606: (i) splits signals processed by a first active RF hardware unit into four power-reduced RF signals that are provided at a first output port of the four output ports 610, (ii) splits signals processed by a second active RF hardware unit into four power-reduced RF signals that are provided at a second output port of the four output ports 610, (iii) splits signals processed by a third active RF hardware unit into four power-reduced RF signals that are provided at a third output port of the four output ports 610, and (iv) splits signals processed by a fourth active RF hardware unit into four power-reduced RF signals that are provided at a fourth output port of the four output ports 610.

Due to the phase shifts implemented by the input matrix 602 and the output matrix 606, copies of "RF Signal 1" provided at a first, second, and third output port of the four output ports 610 cancel each other out, while copies of "RF Signal 1" provided at a fourth output port of the four output ports 610 have the same phase and are constructively combined together.

It is apparent from the redundancy architecture 600 shown in FIGS. 6A and 6B that if, for example, one of the active RF hardware units fails and does not output any RF signals, the amplitude of the signal provided at the fourth output port would be degraded by loss of one-quarter of the RF hardware, which would introduce an amplitude reduction and a phase alignment error.

Further, if one of the active RF hardware units fails, copies of another RF input signal, such as "RF Signal 2" (not shown) provided at the fourth output port might not cancel out entirely. However, the amplitude of the sum of copies of "RF Signal 2" would be low. Assuming $A_1$ is equal to $A_2$, the amplitude of the sum of copies of "RF Signal 2" would be relatively smaller than the amplitude of the sum of the copies of "RF Signal 1". Hence, the sum of the copies of "RF Signal 2" could be cancelled out from the RF signals provided at the fourth output port using signal processing.

The amplitudes of the signals shown at the output ports 610 in FIG. 6 may differ, depending on the type of processing carried out by the four active RF hardware units 604. For instance, the four active RF hardware units 604 may include amplifiers that amplify the RF signals output by the input matrix 602, thereby amplifying the amplitude of the signals provided at the output ports 610.

Figure 7:
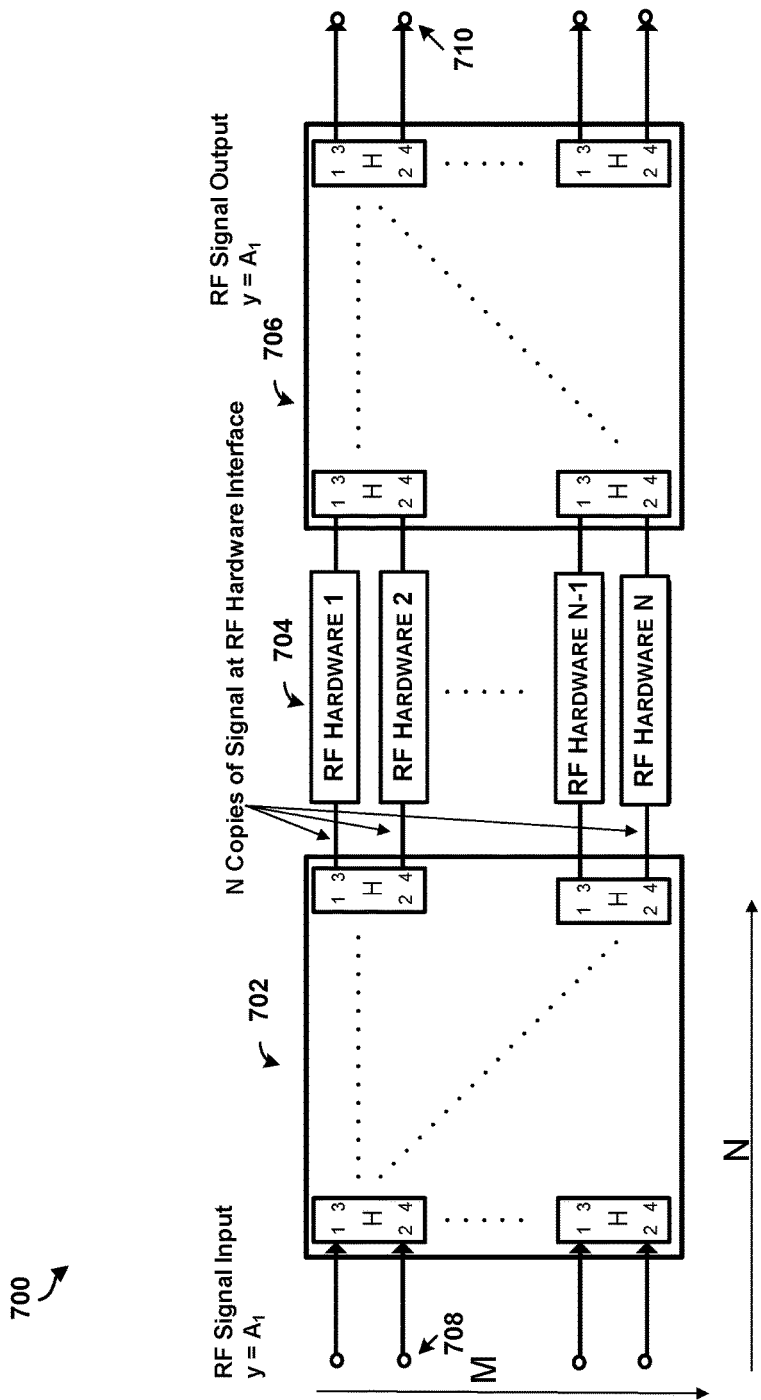
FIG. 7 illustrates another example redundancy architecture for a communications system, according to an example embodiment.

FIG. 7 illustrates another example redundancy architecture 700 for a communications system. As shown in FIG. 7, the example redundancy architecture 700 includes an m×n input matrix 702, n active RF hardware units 704, and an n×m output matrix 706.

The m×n input matrix 702 couples m RF input signals provided at m input ports 708, respectively, to the n active RF hardware units 704. For ease of explanation, only a signal RF input signal designated as "RF Signal 1" is shown in FIG. 7. As shown in FIG. 7, the m×n input matrix 702 can include a plurality of RF signal splitters arranged such that the m×n input matrix 702 splits "RF Signal 1" into n power-reduced RF signals that are provided at the n active RF hardware units 704, respectively.

The n×m output matrix 706 is the inverse of the m×n input matrix 702. The n×m output matrix 706 couples RF signals processed by the n active RF hardware units 704 to m output ports 710. As shown in FIG. 7, the n×m output matrix 706 can include a plurality of RF signal combiners arranged such that RF input signals processed by the n active RF hardware units 704 are split into copies and provided for combination at the m output ports 710.

Figure 8:
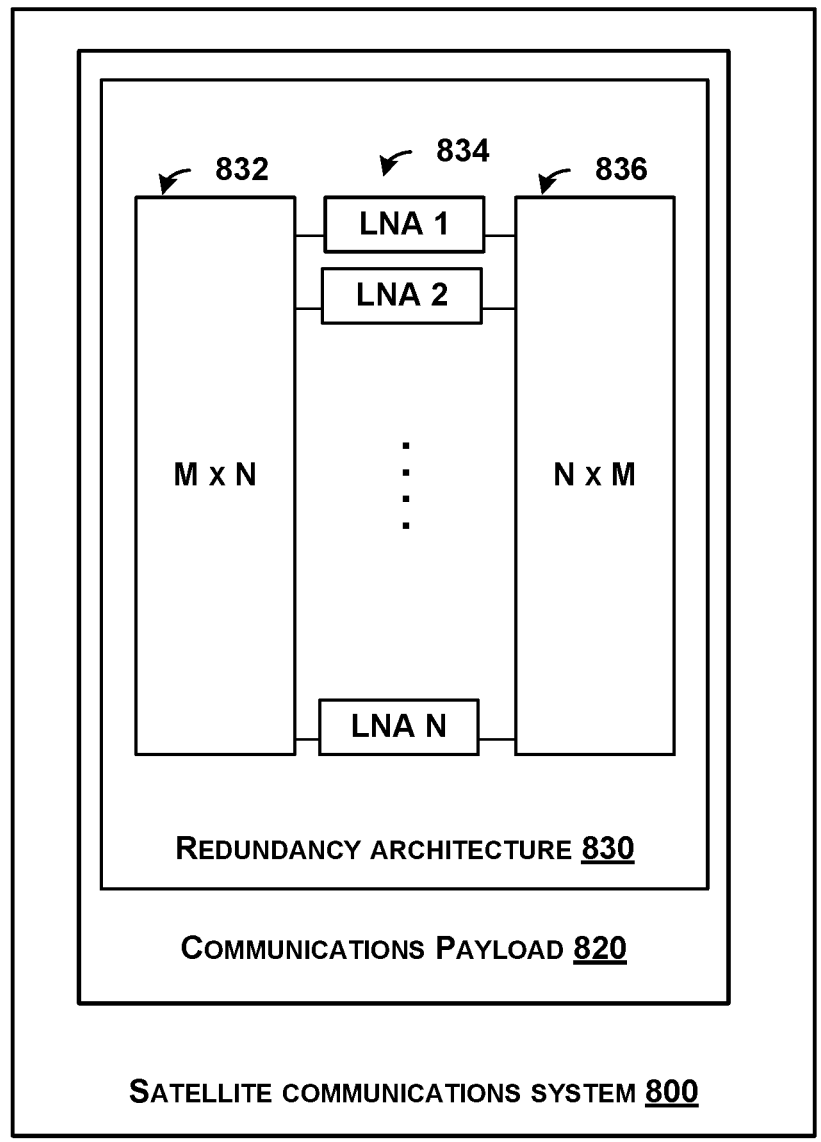
FIG. 8 illustrates an example satellite communications system, according to an example embodiment.

FIG. 8 illustrates an example satellite communications system 800. As shown in FIG. 8, the satellite communications system 800 includes a communications payload 820. The communications payload 820, in turn, includes a redundancy architecture 830. The redundancy architecture includes an m×n input network 832, n active low-noise amplifiers 834, and an n×m output network 836. The m×n input network 832 can be configured in accordance with any of the input networks described herein, such as the m×n input network 302 of FIGS. 3 and 4 or the input matrix 602 of FIG. 6A. The n×m output network 836 can be configured in accordance with any of the output networks described herein, such as the n×m output network 306 of FIGS. 3 and 4 or the output matrix 606 of FIG. 6B.

The description of the different advantageous arrangements has been presented for purposes of illustration and description, and is not intended to be exhaustive or limited to the examples in the form disclosed. After reviewing and understanding the foregoing disclosure, many modifications and variations will be apparent to those of ordinary skill in the art. Further, different examples may provide different advantages as compared to other examples. The example or examples selected are chosen and described in order to best explain the principles, the practical application, and to enable others of ordinary skill in the art to understand the disclosure for various examples with various modifications as are suited to the particular use contemplated.

What is claimed is:

1. A redundancy architecture for a communications system, the redundancy architecture comprising:
   a plurality of active radio-frequency (RF) hardware units arranged in parallel, each active RF hardware unit comprising a low-noise amplifier;
   one or more RF signal splitters configured to couple a plurality of RF input signals to the plurality of active RF hardware units, wherein the one or more RF signal splitters are configured to:
      split each RF input signal of the plurality of RF input signals into multiple copies of the RF input signal, and
      provide each copy of the multiple copies of the RF input signal to a different one of the plurality of active RF hardware units; and
   one or more RF signal combiners configured to couple RF signals processed by the plurality of active RF hardware units to a plurality of RF output paths, wherein, for each of the plurality of RF input signals processed by the plurality of active RF hardware units, the one or more RF signal combiners are configured to:
      combine the multiple copies of the RF input signal into an RF output signal, and
      provide the RF output signal at an RF output path of the plurality of RF output paths corresponding to the RF input signal,
   wherein each of the RF input signals of the plurality of RF input signals pass through the redundancy architecture orthogonal in phase to one another, and
   wherein each of the provided RF output signals are orthogonal in phase to one another.

2. The redundancy architecture of claim 1, configured such that failure of any given one of the plurality of active RF hardware units causes distributed signal degradation rather than causing a signal interruption.

3. The redundancy architecture of claim 1, configured such that, upon failure of any given one or more of the plurality of active RF hardware units, the redundancy architecture still provides all of the RF output signals at the RF output paths without having to switch in a spare RF hardware unit.

4. The redundancy architecture of claim 1, wherein the one or more RF signal splitters comprises an input network having m inputs and n outputs, wherein each output of the input network is coupled to a different one of the plurality of active RF hardware units.

5. The redundancy architecture of claim 4, wherein the one or more RF signal combiners comprises an output network having n inputs and m outputs, wherein each input of the output network is coupled to a different one of the plurality of active RF hardware units.

6. The redundancy architecture of claim 5, wherein the input network is an input matrix.

7. The redundancy architecture of claim 6, wherein the output network is an output matrix.

8. The redundancy architecture of claim 1, wherein splitting an RF input signal into multiple copies of the RF input signal comprises splitting the RF input signal into: a first power-reduced RF signal having a same phase as a phase of the RF input signal and a second power-reduced RF signal having a different phase than the phase of the RF input signal.

9. The redundancy architecture of claim 1, wherein the RF input signals of the plurality of RF input signals operate over a same frequency band.

10. The redundancy architecture of claim 9, wherein the communications system is a communications payload of a satellite.

11. A redundancy architecture for a communications system, the redundancy architecture comprising:
   a series of input ports;
   a series of output ports;
   a plurality of active radio-frequency (RF) hardware units arranged in parallel, each active RF hardware unit comprising a low-noise amplifier;
   at least one RF signal splitter connecting the series of input ports to the plurality of active RF hardware units; and
   at least one RF signal combiner connecting the plurality of active RF hardware units to the series of output ports,
   wherein the redundancy architecture is configured such that an RF input signal provided at any given input port of the series of input ports is split into multiple copies of the RF input signal that are then processed by respective active RF hardware units of the plurality of active RF hardware units and, after being processed, combined into an RF output signal at a given output port of the series of output ports, and
   wherein the redundancy architecture is configured such that the RF input signal passes through the redundancy architecture orthogonal in phase to another RF input signal provided at another input port of the series of input ports, and
   wherein the redundancy architecture is configured such that the RF output signal is orthogonal in phase to another output signal provided at another output port of the series of output ports.

12. The redundancy architecture of claim 11, configured such that failure of any given one of the plurality of active RF hardware units degrades a quality of the RF output signal but does not cause a signal interruption of the RF output signal.

13. The redundancy architecture of claim 11, configured such that, upon failure of any given one or more of the plurality of active RF hardware units, the redundancy architecture still provides the RF output signal at the given output port without having to switch in a spare RF hardware unit.

14. The redundancy architecture of claim 11, wherein the at least one RF signal splitter comprises an input network having m inputs and n outputs, wherein each output of the input network is coupled to a different one of the plurality of active RF hardware units.

15. The redundancy architecture of claim 14, wherein the at least one RF signal combiner comprises an output network having n inputs and m outputs, wherein each input of the output network is coupled to a different one of the plurality of active RF hardware units.

16. A redundancy architecture for a communications system, the redundancy architecture comprising:

m input ports;

m output ports;

n active radio-frequency (RF) hardware units arranged in parallel, each active RF hardware unit comprising a low-noise amplifier;

an m×n input matrix connecting the m input ports to the n active RF hardware units; and an n×m output matrix connecting the n active RF hardware units to the m output ports, wherein the redundancy architecture is configured such that an RF input signal provided at any given input port of the m input ports is split into n copies of the RF input signal that are then processed by respective active RF hardware units of the n active RF hardware units and, after being processed, combined into an RF output signal at a given output port of the m output ports, wherein the redundancy architecture is configured such that the RF input signal passes through the redundancy architecture orthogonal in phase to another RF input signal provided at another input port of the m input ports, and wherein the redundancy architecture is configured such that the RF output signal is orthogonal in phase to another output signal provided at another output port of the m output ports.

17. The redundancy architecture of claim 16, wherein the redundancy architecture does not include any spare hardware units configured to be switched into the redundancy architecture.

18. The redundancy architecture of claim 16, wherein the communications system is a communications payload of a satellite.

* * * * *